United States Patent
Kobae et al.

(10) Patent No.: US 7,134,588 B2
(45) Date of Patent: Nov. 14, 2006

(54) BONDING TOOL FOR ULTRASONIC BONDING AND METHOD OF ULTRASONIC BONDING

(75) Inventors: Kenji Kobae, Kawasaki (JP); Takashi Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/019,623

(22) Filed: Dec. 23, 2004

(65) Prior Publication Data
US 2006/0065697 A1 Mar. 30, 2006

(30) Foreign Application Priority Data
Sep. 29, 2004 (JP) .............................. 2004-283234

(51) Int. Cl.
*B23K 1/06* (2006.01)
*B23K 5/20* (2006.01)
*B32B 37/00* (2006.01)

(52) U.S. Cl. .................. 228/1.1; 228/110.1; 156/73.1; 156/580.2

(58) Field of Classification Search ...................... None
See application file for complete search history.

(56) References Cited

U.S. PATENT DOCUMENTS

| | | | | |
|---|---|---|---|---|
| 3,844,869 | A * | 10/1974 | Rust, Jr. ..................... | 156/358 |
| 5,487,802 | A * | 1/1996 | Mizuta et al. ............. | 156/73.1 |
| 6,089,438 | A * | 7/2000 | Suzuki et al. ................ | 228/1.1 |
| 6,625,871 | B1 * | 9/2003 | Schmidt et al. .......... | 29/603.06 |
| 6,824,630 | B1 * | 11/2004 | Oishi et al. ................ | 156/73.1 |

FOREIGN PATENT DOCUMENTS

| | | | |
|---|---|---|---|
| JP | 5-21541 | | 1/1993 |
| JP | 05235117 | A * | 9/1993 |
| JP | 7-58155 | | 3/1995 |
| JP | 07058155 | A * | 3/1995 |
| JP | 2000-315708 | | 11/2000 |
| JP | 2004221294 | A * | 8/2004 |

* cited by examiner

*Primary Examiner*—Lynne R. Edmondson
(74) *Attorney, Agent, or Firm*—Armstrong, Kratz, Quintos, Hanson & Brooks, LLP

(57) ABSTRACT

Changes in the form of a pressure welding part of a bonding tool for ultrasonic bonding due to abrasion of the pressure welding part and/or accumulation of foreign matter, such as plating material, on the pressure welding part during use of the bonding tool are prevented, so that the bonding tool can carry out ultrasonic bonding stably. A plurality of protrusions with curved outer surfaces are formed on the pressure welding part that contacts the bonded part during ultrasonic bonding. The protrusions can be formed with spherical outer surfaces by forming concave grooves in a grid in an end surface of the bonding tool and then sandblasting the end surface of the bonding tool.

6 Claims, 3 Drawing Sheets

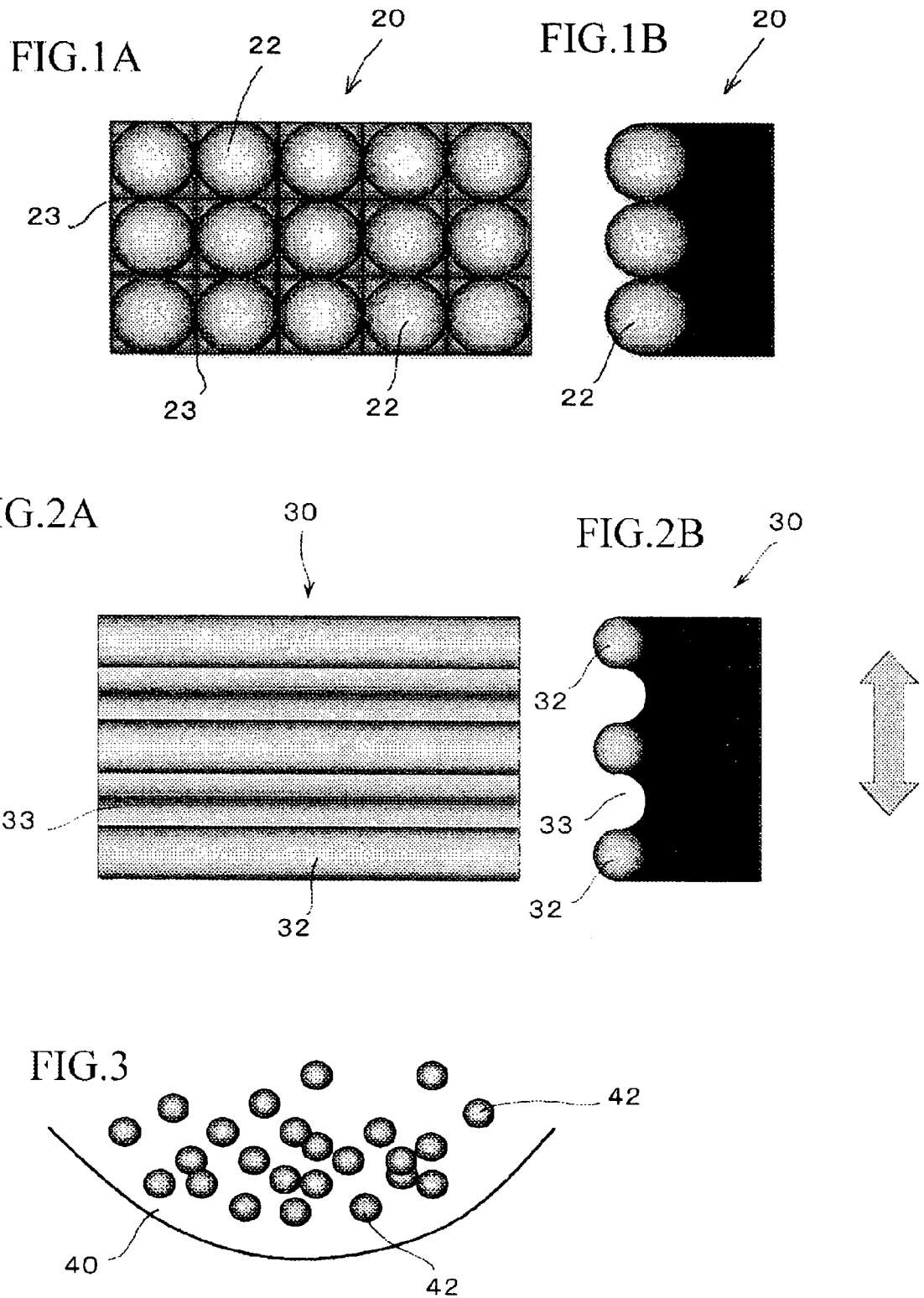

BONDING TOOL FOR ULTRASONIC BONDING AND METHOD OF ULTRASONIC BONDING

BACKGROUND OF THE INVENTION

1. Field of the Invention

The present invention relates to a bonding tool for ultrasonic bonding and a method of ultrasonic bonding, and in more detail to a bonding tool for ultrasonic bonding and a method of ultrasonic bonding that are used during assembly and the like of a carriage assembly that composes a magnetic disk apparatus.

2. Related Art

Ultrasonic bonding is widely used for bonding operations such as the flip-chip bonding of semiconductor chips and the bonding of inner leads of TAB tapes and electrodes. During ultrasonic bonding, it is important to reliably transmit ultrasonic vibration to the parts to be bonded using a bonding tool so that bonding can be carried out stably and reliably. To do so, research is being conducted into carrying out bonding with projections and/or roughened surface parts having been formed on the pressure welding part of an end surface of the bonding tool, which contacts the bonded object and applies ultrasound, so as to prevent slippage between the pressure welding part of the bonding tool and a contact surface of the bonded object (see Patent Documents 1 to 3).

Patent Document 1

Japanese Laid-Open Patent Publication No. H05-21541

Patent Document 2

Japanese Laid-Open Patent Publication No. H07-58155

Patent Document 3

Japanese Laid-Open Patent Publication No. 2000-315708

However, when ultrasonic bonding is repeatedly carried out using a bonding tool, abrasion occurs for the pressure welding part of the bonding tool and foreign matter adheres to the pressure welding part, so that the form of the pressure welding part of the bonding tool gradually changes from the initial state.

FIG. 7A shows the initial state of a pressure welding part of a bonding tool 10, and FIG. 7B shows the state after the bonding tool 10 has been used many times. Due to gold plating formed on surfaces of leads of the bonded object and/or a nickel or copper layer that is a base for the plating adhering to the pressure welding part of the bonding tool 10, the end surfaces of protrusions 12 become rounded as shown in FIG. 7B.

In this way, when the form of the pressure welding part of the bonding tool 10 changes, slipping occurs between the bonding tool 10 and the contact surface of the bonded object, so that there are the problems that ultrasonic vibration is no longer reliably transmitted from the bonding tool to the bonded object, the bonding strength of the bonds gradually falls from the initial state of the bonding tool 10, and a stabilized bonding strength can no longer be achieved.

SUMMARY OF THE INVENTION

The present invention was conceived to solve the problems described above, and it is an object of the present invention to provide (i) a bonding tool for ultrasonic bonding for which changes in the form of a pressure welding part due to abrasion of the pressure welding part during use of the bonding tool and/or accumulation of foreign matter, such as plating material, on the pressure welding part are prevented so that ultrasonic bonding can be carried out stably, and (ii) a method of ultrasonic bonding using the bonding tool.

To achieve the stated object, a bonding tool for ultrasonic bonding according to the present invention includes: a pressure welding part that contacts a bonded part during the ultrasonic bonding; and a plurality of protrusions with curved outer surfaces that are formed on the pressure welding part.

The protrusions may be formed with spherical outer surfaces by forming concave grooves in a grid on an end surface of the bonding tool and then sandblasting the end surface of the bonding tool. By doing so, the protrusions can be formed in a grid arrangement on the end surface of the bonding tool.

Alternatively, the protrusions may be formed so as to extend continuously with a slim form in one direction in parallel at predetermined intervals on the pressure welding part of the bonding tool. Such bonding tool is used with the direction of the ultrasonic vibration set perpendicular to the lengthwise direction of the protrusions.

The bonding tool may be fabricated using a material produced by uniformly dispersing, in a main material composing the bonding tool, a hard material composed of a material with higher abrasion resistance than the main material as lumps of particles.

A method of ultrasonic bonding according to the present invention ultrasonically bonds a bonded part using the bonding tool described above, and includes a step of bonding that applies ultrasound in a state where the pressure welding part of the bonding tool has been placed in contact with the bonded part and gradually increases a pressing force applied onto the bonded part by the bonding tool from a start of bonding.

A method of manufacturing a carriage assembly used in a magnetic disk apparatus according to the present invention uses an ultrasonic bonding apparatus in which the bonding tool described above is attached to a horn, the method of manufacturing including: a step of positioning a carriage arm and a flexible circuit board; and a step of ultrasonically bonding electrical connecting parts of the carriage arm and the flexible circuit board using the bonding tool.

The bonding tool for ultrasonic bonding according to the present invention can suppress changes in the form of the pressure welding part of the bonding tool due to use, and therefore can prevent the bonding strength of the ultrasonic bonds from becoming unstable. This means that ultrasonic bonding can be carried out reliably. In addition, with the method of ultrasonic bonding according to the present invention, it is possible to carry out ultrasonic bonding reliably without displacing the bonded part.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings:

FIGS. 1A and 1B are respectively an end view and a side view showing the construction of a bonding tool that is a first embodiment of the present invention;

FIGS. 2A and 2B are respectively an end view and a side view showing the construction of a bonding tool that is a second embodiment of the present invention;

FIG. 3 is a diagram useful in explaining a material composing a bonding tool;

DESCRIPTION OF THE PREFERRED EMBODIMENTS

Figure 4A:
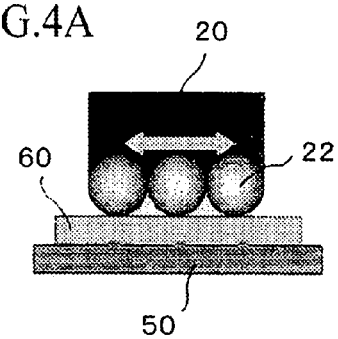
FIGS. 4A to 4C are diagrams useful in explaining a method of ultrasonic bonding according to the present invention.

Preferred embodiments of a bonding tool for ultrasonic bonding and a method of ultrasonic bonding that uses this bonding tool according to the present invention will now be described in detail.

Bonding Tool

First Embodiment

FIGS. 1A and 1B are respectively an end view and a side view of a bonding tool showing the construction that is a first embodiment of a bonding tool according to the present invention. A bonding tool 20 of the present embodiment is characterized by a plurality of protrusions 22 whose outer surfaces are spherical being formed in a grid arrangement on a pressure welding part of the tool that contacts a bonded part during ultrasonic bonding. As shown in FIG. 1B, the protrusions 22 are formed so as to project outward hemispherically on an end surface of the bonding tool 20.

The formation of the protrusions 22 whose outer surfaces are spherical on an end surface of the bonding tool 20 may be carried out by forming concave grooves 23 in a grid as shown in FIG. 1A and then sandblasting the end surface of the bonding tool 20.

Once the concave grooves 23 have been formed in a grid on the end surface of the bonding tool 20 and the end surface on which the concave grooves 23 have been formed has been sandblasted, parts where the concave grooves 23 intersect are more deeply scraped than other parts, so that as shown in FIG. 1A, the protrusions 22 are formed on the end surface of the bonding tool 20 with spherical outer surfaces. Since the protrusions 22 are formed one at a time in sections surrounded by the concave grooves 23, the intervals between the concave grooves 23 are set in accordance with the size of the protrusions 22 to be formed.

When the bonding tool 20 according to the present embodiment is used during ultrasonic bonding, since the outer surfaces of the protrusions 22 formed on the pressure welding part of the bonding tool 20 are spherically formed in advance, even if the bonding tool 20 is used repeatedly and abrasion of the pressure welding part of the bonding tool 20 occurs or plating material provided on a bonded part accumulates on the pressure welding part, there is no large change in the form of the protrusions 22 from the spherical forms. As a result, during ultrasonic bonding using the bonding tool 20, it is possible to suppress fluctuations over time in the action of the ultrasound on the bonded part, so that the problem of the bonding strength of the ultrasonic bonds becoming unstable can be eliminated.

Second Embodiment

FIGS. 2A and 2B are respectively an end view and a side view of a bonding tool showing the construction that is a second embodiment of a bonding tool. A bonding tool 30 according to the present embodiment is characterized by a plurality of protrusions 32 that are slim and continuously extend in one direction being formed in parallel at predetermined intervals on a pressure welding part of the tool. As shown in FIG. 2B, the protrusions 32 are formed with upper ends that are arc-shaped in cross-section and bottom surfaces of grooves 33, which are formed between adjacent protrusions 32, are also arc-shaped in cross-section, so that a side surface of the pressure welding part of the bonding tool 30 is formed in a wave shape.

Wire-cut electrical discharge machining may be used to form the protrusions 32 on the pressure welding part of the bonding tool 30 with upper ends that are arc-shaped in cross-section and to form the side surface of the pressure welding part of the tool in a wave shape as in the present embodiment.

During ultrasonic bonding using the bonding tool 30 equipped with the pressure welding part of the present embodiment, as shown in FIG. 2B, the bonding tool 30 is used with the direction of vibration of the bonding tool 30 set perpendicular to the lengthwise direction of the protrusions 32 formed on the pressure welding part. By setting the direction of vibration of the bonding tool 30 in this way, it is possible to carry out ultrasonic bonding with the pressing action of the protrusions 32 acting effectively on the bonded part.

With the bonding tool 30 of the present embodiment, in the same way as the bonding tool 20 of the first embodiment, the protrusions 32 provided on the pressure welding part of the tool are formed in advance so as to be arc-shaped in cross-section, so that even if the bonding tool 30 is used repeatedly and abrasion occurs for the protrusions 32 or foreign matter such as plating material accumulates on or adheres to the protrusions 32, there will be no large change in the rounded form of the protrusions 32. In this way, since there is no large change in the form of the pressure welding part of the bonding tool 30 between the initial state and a state after use, the action of the ultrasound on the bonded part does not significantly fluctuate due to use of the bonding tool 30, and stable ultrasonic bonding can be carried out.

The bonding tool described above is fabricated using a material that has a predetermined abrasion resistance and ductility for the pressure welding part that contacts the bonded part. As the material used for manufacturing the bonding tool, as shown in FIG. 3, it is effective to use a material produced by adding, to a main material 40, a hard material 42 composed of a material with higher abrasion resistance than the main material 40. The hard material 42 is in the form of lumps of particles that are uniformly dispersed in the main material 40.

With a bonding tool fabricated using the above material where the main material 40 includes grains of hard material 42 with higher ductility, when abrasion of the pressure welding part occurs due to use of the bonding tool, the hard material 42 on the inside becomes newly exposed as the main material 40 is scraped away. In this way, like a grindstone, as the bonding tool is used, a frictional surface of the pressure welding part is renewed, so that the frictional force that acts on the bonded part is kept constant and the required ultrasound can be made to act on the bonded part. Although this method of forming the bonding tool from the main material 40 and the hard material 42 can be used for both the bonding tools 20 and 30 described above, it is also effective to use a material conventionally used to fabricate a bonding tool.

Method of Ultrasonic Bonding

Figure 4B:
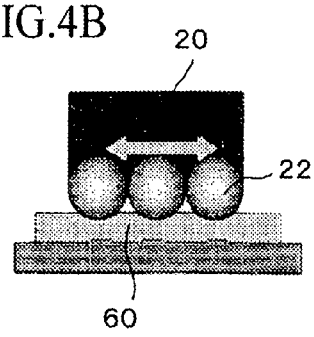
Figure 4C:
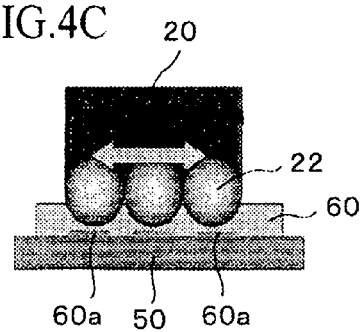

FIGS. 4A to 4C show an example application where a lead 60 is ultrasonically bonded onto a connection pad 50 formed on a flexible circuit board using one of the bonding tools 20, 30 described above.

FIG. 4A shows a state where the lead 60 is positioned on the connection pad 50, the bonding tool 20 has been brought into contact with the top of the lead 60, and the application of ultrasound has started. In this state, the protrusions 22 formed on the pressure welding part of the bonding tool 20 slightly contact the upper surface of the lead 60.

FIG. 4B shows a state where the pressing force applied by the bonding tool 20 has increased from the state in FIG. 4A and the ultrasound is applied with the outer surfaces of the protrusions 22 somewhat cutting into the upper surface of the lead 60. FIG. 4C shows a state where the pressing force applied by the bonding tool 20 has increased further from the state shown in FIG. 4B, and ultrasound is being applied to the bonding tool 20.

The method of ultrasonic bonding according to the present embodiment is characterized in that when the bonding tool 20 is placed in contact with the lead 60 and ultrasound is applied, bonding is carried out while gradually increasing the pressing force that presses upon the lead 60. When the pressing force applied by the bonding tool 20 increases, the range in which the protrusions 22 and the lead 60 are in contact gradually increases and the bonding area of the bonds 60a of the connection pad 50 and the lead 60 gradually expands so that the connection pad 50 and the lead 60 are reliably bonded together.

Figure 5:
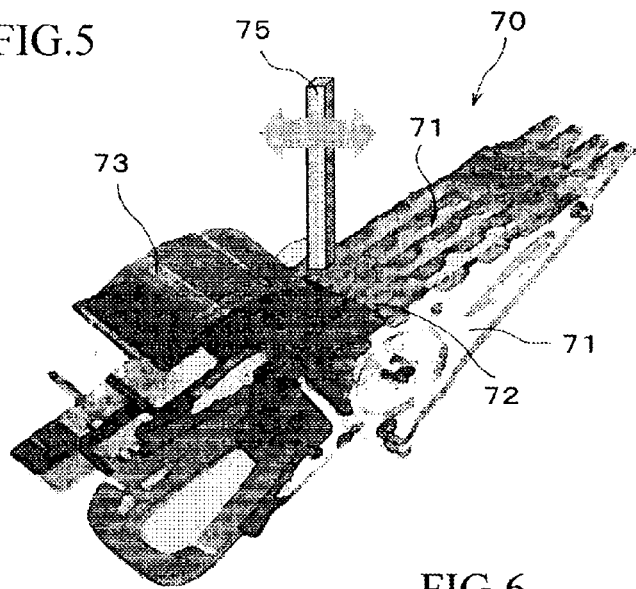
FIG. 5 is a diagram useful in explaining a method of assembling a carriage assembly using the method of ultrasonic bonding.
Figure 6:
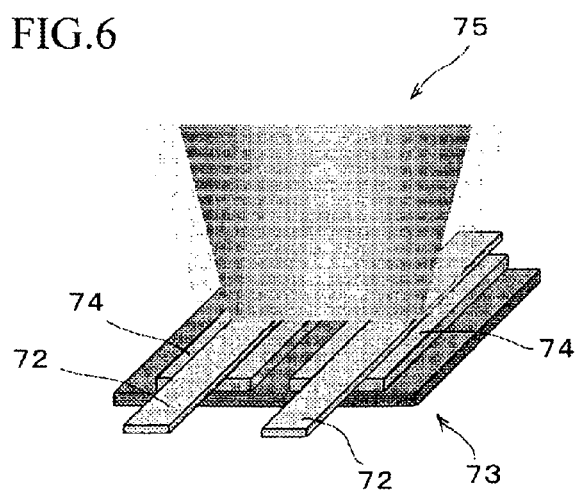
FIG. 6 is a diagram useful in explaining a method of bonding together flying leads and a flexible circuit board.
Figure 7A:
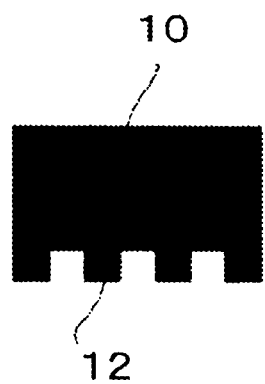
FIGS. 7A and 7B are diagrams useful in explaining the construction of a conventional bonding tool.
Figure 7B:
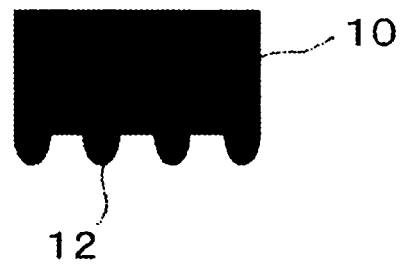

FIGS. 5 and 6 show an example where the method of ultrasonic bonding described above is used to assemble a carriage assembly used in a magnetic disk apparatus. FIG. 5 shows a method of bonding flying leads 72 formed on a side surface of a carriage 71 and connection pads 74 provided on a flexible circuit board 73 by ultrasonic bonding. In FIGS. 5 and 6, reference numeral 75 designates a bonding tool that is attached to a horn (not shown) of an ultrasonic bonding apparatus, with a state where the end surface (pressure welding part) of the bonding tool 75 presses the flying leads 72 to carry out ultrasonic bonding being shown.

FIG. 6 shows an enlargement of the parts bonded together by the bonding tool 75. In FIG. 6, the flying leads 72 are positioned on the connection pads 74 of the flexible circuit board 73, and the bonding tool 75 presses the flying leads 72 and applies ultrasound to the flying leads 72 to bond the flying leads 72 to the connection pads 74.

After the bonding tool 75 has been positioned on the flying leads 72, as described above, the pressing force of the bonding tool 75 is gradually increased to ultrasonically bond the flying leads 72 and the connection pads 74, so that displacement of the flying leads 72 is prevented and the flying leads 72 can be reliably bonded to the connection pads 74 of the flexible circuit board 73.

The above method of ultrasonic bonding that gradually increases the pressing force of the bonding tool on the bonded part can be effectively used to carry out bonding correctly and reliably when bonding fine leads onto electrodes and the like, such as when assembling a carriage assembly of a magnetic disk apparatus. A carriage assembly assembled using the above method of ultrasonic bonding is assembled with high reliability, so that the reliability of a magnetic disk apparatus in which the carriage assembly is incorporated can also be improved.

What is claimed is:

1. A bonding tool for ultrasonic bonding, comprising:
    a pressure welding part that contacts a bonded part during the ultrasonic bonding; and
    a plurality of protrusions, having upper ends that are arc-shaped in cross-section, that are formed in a parallel line arrangement on the pressure welding part by forming concave grooves on an end surface of the bonding tool and then sandblasting the end surface of the bonding tool,
    wherein the protrusions are formed in the parallel line arrangement so as to extend continuously with a slim form in one direction in parallel at predetermined intervals on the pressure welding part of the bonding tool.

2. A bonding tool for ultrasonic bonding comprising:
    a pressure welding part that contacts a bonded part during the ultrasonic bonding; and
    a plurality of protrusions with curved outer surfaces that are formed on the pressure welding part;
    wherein the bonding tool is fabricated using a material produced by uniformly dispersing, in a main material composing the bonding tool, a hard material composed of a material with higher abrasion resistance than the main material as lumps of particles.

3. A method of ultrasonic bonding, that ultrasonically bonds a bonded part using a bonding tool for ultrasonic bonding including a pressure welding part that contacts a bonded part during the ultrasonic bonding and a plurality of protrusions, having upper ends that are arc-shaped in cross-section, that are formed in a parallel line arrangement on the pressure welding part by forming concave grooves on an end surface of the bonding tool and then sandblasting the end surface of the bonding tool, the method comprising a step of bonding that applied ultrasound in a state where the pressure welding part of the bonding tool has been placed in contact with the bonded part and gradually increases a pressing force applied onto the bonded part by the bonding tool from a start of bonding,
    wherein the protrusions of the bonding tool are formed in the parallel line arrangement so as to extend continuously with a slim form in one direction in parallel at predetermined intervals on the pressure welding part of the bonding tool.

4. A method of ultrasonic bonding that ultrasonically bonds a bonded part using a bonding tool for ultrasonic bonding including a pressure welding part that contacts a bonded part during the ultrasonic bonding and a plurality of protrusions with curved outer surfaces that are formed on the pressure welding part, the method comprising a step of bonding that applied ultrasound in a state where the pressure welding part of the bonding tool has been placed in contact with the bonded part and gradually increases a pressing force applied onto the bonded part by the bonding tool from a start of bonding;
    wherein the bonding tool is fabricated using a material produced by uniformly dispersing, in a main material comprising the bonding tool, a hard material composed of a material with higher abrasion resistance than the main material as lumps of particles.

5. A method of manufacturing a carriage assembly used in a magnetic disk apparatus using an ultrasonic bonding apparatus in which a bonding tool for ultrasonic bonding, which includes a pressure welding part that contacts a bonded part during the ultrasonic bonding and a plurality of protrusions, having upper ends that are arc-shaped in cross-section, that are formed in a parallel line arrangement on the pressure welding part by forming concave grooves on an end surface of the bonding tool and then sandblasting the end surface of the bonding tool, is attached to a horn, the method of manufacturing comprising:

a step of positioning a carriage arm and a flexible circuit board; and a step of ultrasonically bonding electrical connecting parts of the carriage arm and the flexible circuit board using the bonding tool, wherein the protrusions on the bonding tool are formed in the parallel line arrangement so as to extend continuously with a slim form in one direction in parallel at predetermined intervals on the pressure welding part of the bonding tool.

6. A method of manufacturing a carriage assembly used in a magnetic disk apparatus using an ultrasonic bonding apparatus in which a bonding tool for ultrasonic bonding, which includes a pressure welding part that contacts a bonded part during the ultrasonic bonding and a plurality of protrusions with curved outer surfaces that are formed on the pressure welding part, is attached to a horn, the method of manufacturing comprising:

a step of positioning a carriage arm and a flexible circuit board; and a step of ultrasonically bonding electrical connecting parts of the carriage arm and the flexible circuit board using the bonding tool;

wherein the bonding tool is fabricated using a material produced by uniformly dispersing, in a main material composing the bonding tool, a hard material composed of a material with higher abrasion resistance than the main material as lumps of particles.

* * * * *